United States Patent
Cook

(10) Patent No.: US 6,692,850 B2
(45) Date of Patent: Feb. 17, 2004

(54) CONTROLLED STRESS OPTICAL COATINGS FOR MEMBRANES

(75) Inventor: Christopher C. Cook, Bedford, MA (US)

(73) Assignee: AXSUN Technologies, Inc., Billerica, MA (US)

( * ) Notice: Subject to any disclaimer, the term of this patent is extended or adjusted under 35 U.S.C. 154(b) by 0 days.

(21) Appl. No.: 09/801,376

(22) Filed: Mar. 7, 2001

(65) Prior Publication Data

US 2002/0127438 A1 Sep. 12, 2002

(51) Int. Cl.$^7$ ............................... B32B 7/02; B32B 9/00
(52) U.S. Cl. ..................... 428/699; 428/701; 428/702; 428/212
(58) Field of Search ................... 428/212, 697, 428/699, 688, 689, 701, 702

(56) References Cited

U.S. PATENT DOCUMENTS

| | | | | |
|---|---|---|---|---|
| 4,940,636 A | * | 7/1990 | Brock et al. | 428/426 |
| 5,583,683 A | * | 12/1996 | Scobey | 359/127 |
| 5,674,599 A | * | 10/1997 | Yamada | 428/212 |
| 5,719,989 A | * | 2/1998 | Cushing | 359/587 |
| 6,219,481 B1 | * | 4/2001 | Cheng | 385/24 |
| 6,271,052 B1 | * | 8/2001 | Miller et al. | 438/50 |
| 6,327,062 B1 | * | 12/2001 | King et al. | 359/124 |
| 6,479,166 B1 | * | 11/2002 | Heuer et al. | 428/620 |
| 2002/0054424 A1 | * | 5/2002 | Miles | 359/291 |

FOREIGN PATENT DOCUMENTS

| | | | |
|---|---|---|---|
| CH | 683006 A5 | 12/1993 | ........... C23C/14/32 |
| EP | 0 497 499 A1 | 8/1992 | ........... C23C/14/06 |
| EP | 0 740 377 A1 | 10/1996 | ........... H01S/3/085 |
| JP | 03222287 | 10/1991 | ........... H05B/33/22 |
| JP | 07154012 | 6/1995 | ............ H01S/3/08 |

* cited by examiner

*Primary Examiner*—John J. Zimmerman
*Assistant Examiner*—G. A. Blackwell-Rudasik
(74) *Attorney, Agent, or Firm*—J. Grant Houston

(57) ABSTRACT

A thin membrane having a thin film optical coating thereon is formed from multiple layers of different materials in which the overall stress of the thin film is not more than 15 MPa. Such films can be formed through thermal evaporation with ion assist, by directing an electron beam on a source and evaporating material from the source onto a thin flexible membrane while directing an ion stream onto the membrane. The current of the source of the ion stream should be sufficient to provide a thin film coating that has substantially no porosity. Successive applications at constant current can be deposited, while varying the voltage of the ion stream. The stress of the thin films deposited under each different voltage can be evaluated and the voltage at which the stress is acceptably low can be determined.

26 Claims, 5 Drawing Sheets

CONTROLLED STRESS OPTICAL COATINGS FOR MEMBRANES

BACKGROUND OF THE INVENTION

Wavelength division multiplexing (WDM) systems typically require tunable optical filters, such as Fabry-Perot filters, switches, interference filters, and variable optical attenuators, along with other devices that employ highly reflective mirrors.

Forming thin film highly reflective and/or low absorption mirrors involves the application of multi-layer thin dielectric film coatings on a substrate. The refractive index differences associated with certain material systems such as ceramics require the formation of 10 or more layers to achieve a reflectivity greater than 97%. When the substrate is an optical membrane, such as found in micro-optical electromechanical systems (MOEMS), the coatings can be one-half or more of the thickness of the substrate.

It can be important to maintain a flat or selectively curved reflective surface and to prevent the application of the thin film from forming any "bow" or a controlled bow in the substrate. However, the thinness of some of the membranes makes them highly flexible or susceptible to bow, such that even small surface stresses can lead to deformation, which impacts the optical properties of the resulting device.

The application of highly reflective thin film coatings especially to thin flexible substrates can lead to difficulties arising out of the inherent residual stresses that are generated when the thin films are formed, such as by thermal evaporation or sputtering. For example, the columnar microstructures created during conventional thin film formation can lead to electrostatic attraction between adjacent "columns". This can result in an undesirable tensile stress being present in the thin film. Such stress can affect the flatness of the membrane and thus the optical properties of the resulting device.

SUMMARY OF THE INVENTION

Since each layer develops its own inherent stress properties, forming dielectric coating layers without bowing the thin substrate has proven to be a difficult goal to achieve.

Generally speaking, in accordance with the invention, a membrane, or release structure, having a thin film optical coating thereon which is formed from multiple layers of different materials is provided in which the net stress of the thin film coating on the membrane is low, such as about 10 MegaPascals (MPa) or less. Such films are formed through thermal evaporation, with ion assist, by directing an electron beam at a source, in a known manner, to raise the coating material temperature and evaporate material from the source onto a thin flexible membrane with the assistance of a coincident ion stream. The ion beam current is proportional to the arrival rate of ions and should be made sufficient to provide a thin film coating that has substantially no porosity.

Successive applications of layers of material are preferably deposited at different ion gun voltages and/or current. One embodiment describes a method of utilizing a static ion gun voltage and current to produce a multi-layer coating, which has a predetermined stress value. This is made possible by experimental determination of a stress map, in which the stress of the thin film coatings or layers of thin films deposited at voltages is evaluated and mapped and the voltage at which the stress is substantially 0, or not more than about 10 MPa identified. This voltage, corresponding to the desired stress characteristics, is used to provide additional controlled stress coatings.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Thin flexible membranes having thin film optical coatings, such as dichroic filter coatings or highly reflective coatings, have many important applications. As used herein, the term thin membrane will include release or other suspended structures having a thickness of less than about 50 micrometers ($\mu m$) and that are used in tunable filters, e.g., Fabry-Perot filters or multicavity filters, or deflectable membranes generally for laser cavity length modulators, attenuators, or switches, for example.

Thin film coatings in accordance with the invention generally vary from 1 to 10 micrometers in thickness. They frequently comprise up to 50% or even 100% or greater of the thickness of the membrane to which they are applied.

In certain preferred embodiments of the invention, the MOEMS device that is formed by applying the thin film coating to the flexible membrane is used in tunable Fabry-Perot filters, beam switches, laser cavity reflector, and variable optical attenuators, or other optical devices. A reflective and/or filtering thin film coating is required to be deposited on the membrane with a low or otherwise controlled stress to provide a membrane having predefined optical characteristics, and specifically, surface curvature.

Figure 1:
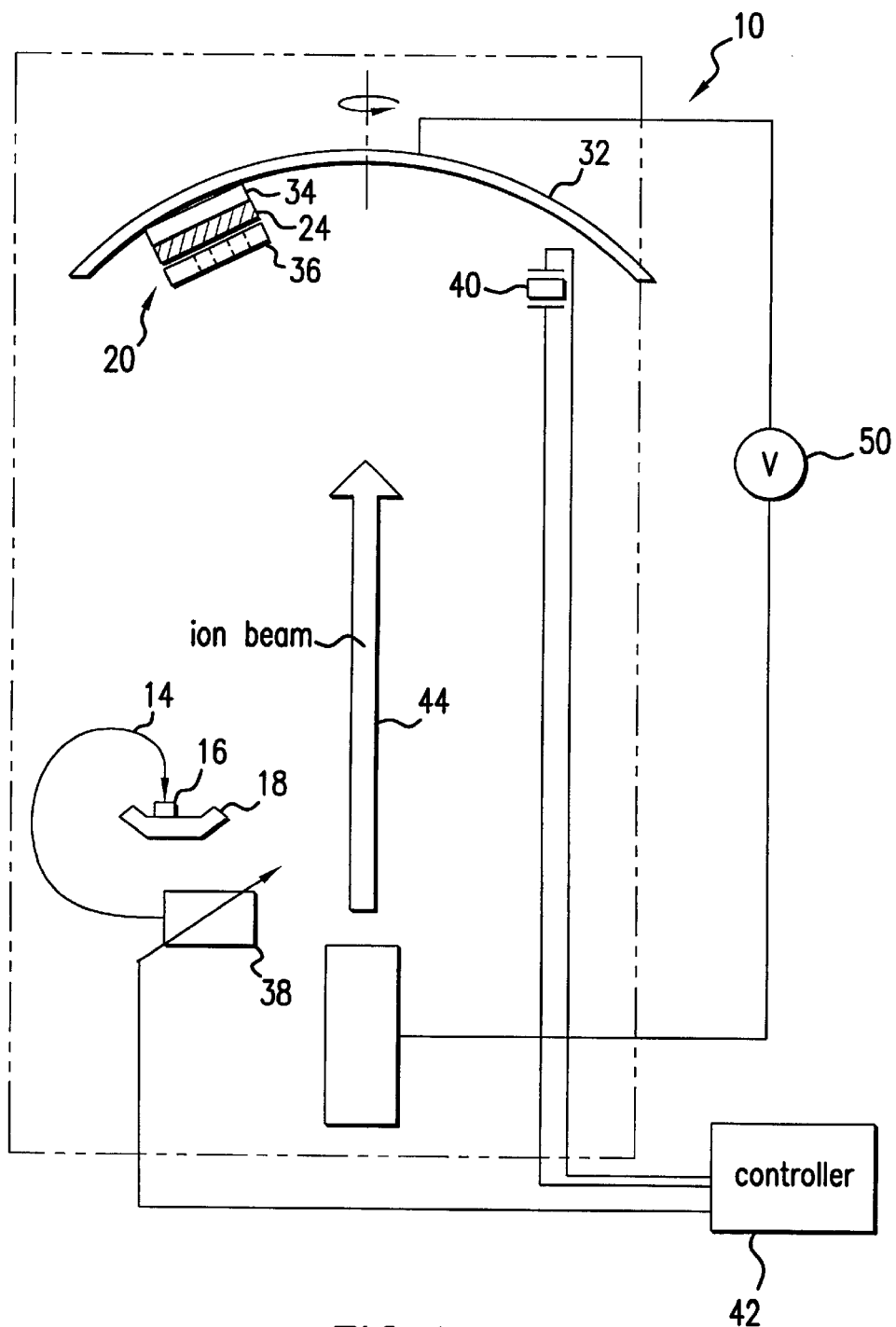
FIG. 1 is a schematic diagram of an ion beam-assisted thermal evaporation thin film coating system to which the present invention is applicable.

FIG. 1 illustrates a thin film coating system 10 to which the present invention is applicable, in which films are deposited via ion beam assisted thermal-evaporation.

The thermal-evaporation is generally performed in a vacuum chamber 12. An electron beam 14 is directed onto a source 16 of the coating material to cause evaporation of the material from a crucible 18 into the vacuum chamber. The materials to be applied, such as titanium dioxide, tantalum pentoxide, or silicon dioxide, for example, have high evaporation temperatures, up to thousands of degrees centigrade. Typically, a rotating crucible holder or hearth is used so that subsequent sources can be switched in. Thus, alternating layers of different materials are deposited by sequentially directing the electron beam to sources of the different materials. For example, a rotating hearth having four pockets is common. After a first layer of a first material is deposited, the hearth is rotated and then the second material is deposited. Material systems having two materials are typical for filters mentioned previously.

The evaporated material will then condense on various surfaces within the chamber 12, including the membrane 24, where it is desired.

In order to facilitate uniformity in the dielectric layers, the device 20, including a substrate or handle material 34 and the membrane or device layer 24, are installed on a rotating dome 32 within the chamber 12. This dome 32 rotates throughout the deposition process, typically. In some embodiments, a distribution shield is further utilized to tune the uniformity of the distribution.

Portions of the membrane are masked in some applications, to provide for the deposition of a coating in a desired configuration or pattern on the membrane 24. In such instances, a shadow mask 36 is commonly used.

In the preferred embodiment, ion-assisted deposition is utilized. Specifically, an ion beam generator is provided that directs an ion beam 44 onto the membrane 24 coincidently with the stream of the evaporated coating material.

Because different materials evaporate at different temperatures, it is generally necessary to alter to operating conditions of to electron beam gun 38 by adjusting the gun's electrical (current) source, whenever the source is changed. It is also advantageous to measure and control the evaporation rates with quartz crystal monitoring. Quartz crystal 40 oscillates and the oscillation frequency is monitored electronically by a controller 42, which provide feedback to control the electron beam 14. In one implementation, the system maintains a substantially constant evaporation rate, in one example. The quartz crystal is switched as material builds up. Thus, the chamber 12 preferably comprises two to up to six or more crystal head, not shown.

In one implementation, the final membrane with the deposited thin film coating has is substantially no "bow". It has been determined that if the final stack of layers has an overall residual stress of substantially zero, measured as a whole, or at least residual stress (tensile or compression) of less than about 15 MegaPascals (MPa), preferably less than about 10 MPa, that the optical properties will not be adversely affected. Procedures in accordance with preferred embodiments of the invention are able to provide films that meet these criteria.

Figure 2:
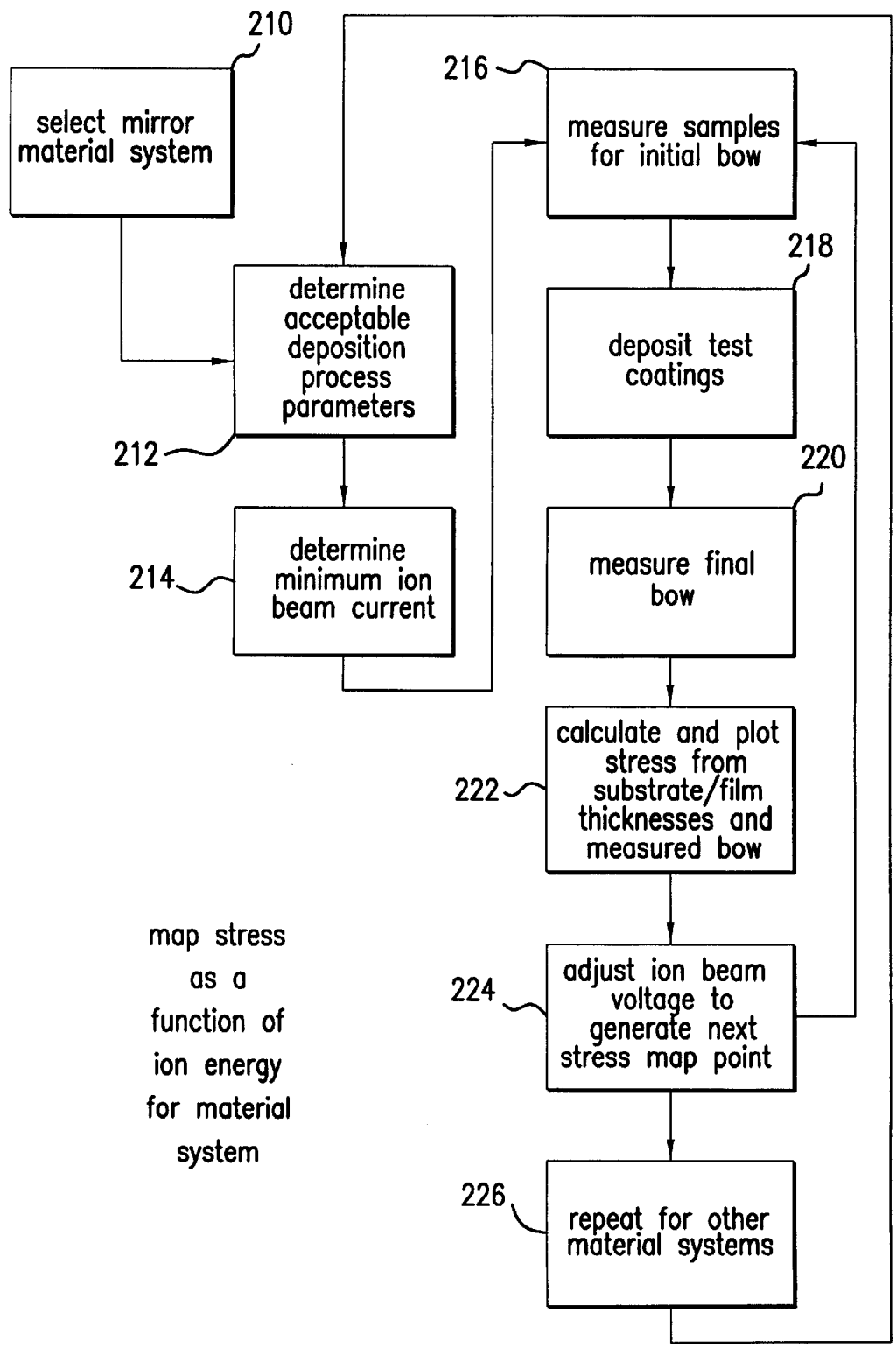
FIG. 2 is a flow diagram illustrating an inventive process for mapping coating stress as a function of ion beam energy or gun voltage for a material system, which process applies principles of the present invention.

FIG. 2 shows a process for mapping the coating stress as a function of ion beam energy for a material system, which process applies principles of the present invention.

After the material system is selected, in step 210, deposition process parameters, such as suitable evaporation rates, are determined in step 212. This can be controlled by adjusting the power of the electron beam 14 that is directed at the coating source 16. As stated above, evaporation rate is determined by reference to the quartz crystal oscillator 40.

A minimum threshold current for the ion beam 44 is established in step 214. The ion beam 44 is believed to frustrate the formation of the columnar micro-structures in the thin film being formed and is therefore understood to help prevent the formation of "voids" between "columns" of thin film material. These voids can permit moisture or other materials from the ambient atmosphere to become incorporated into the thin film layer. This causes the film to swell or otherwise change its properties, which can result in variable internal stresses and spectral shifting of optical properties. Accordingly, it is desirable to substantially eliminate any porosity in the deposited thin film.

The thin film porosity is evaluated, in process, by removing a coated membrane or witness substrate from the vacuum chamber and immediately making a spectral intensity measurement. The coated witness is then stored for several days in humid conditions, with the spectrum being measured periodically. If the material is porous, moisture will be absorbed into the thin film structure, resulting in wavelength shifts. In contrast, if the wavelength measurement stays substantially the same, or changes only due to cooling, then it is concluded that the material is sufficiently non-porous such that atmospheric moisture will not become incorporated and will not have a significant affect on the optical or mechanical properties of the coated membrane.

Once an appropriate current yielding no porosity is selected for use in operating the ion beam, test witness substrates are identified and measured for initial bow in step 216. Then, in step 218, a coating operation is performed while keeping the ion gun current at a value equal to or greater than that determined in step 214. This coating operation is typically for either a single layer or multiple layer coatings.

The tensile or compression stress of the material is measured at the conclusion of each coating operation in step 220 by reference to the net change in the bow of the test substrate. In general, a decrease in tensile stress and an increase in compressive stress should be observed as the ion gun voltage is increased. These values are then preferably plotted in step 222.

Steps 218 through 224 are repeated over a range of different ion gun voltage selections. The process of depositing coatings at different ion beam levels yields a comprehensive stress map for the coating design. Minimally, the ion beam level that generates the desired resultant stress must be identified. Usually, a range or target voltage at which the inherent stress in the material is substantially zero, or within 25 MPa or 10 MPa of zero is established.

Alternatively, for other applications where a controlled, non-zero stress is required to established a controlled bow in the membrane, a tensile or compressive stress level is targeted.

Further, the entire process is repeated in step 226 for other material systems to be used, if necessary for other coating designs.

It should be noted that if the stress is measured and plotted based on the final multi-layer product, that the stress in each individual layer is not necessarily zero. However, it has been determined that regardless of individual residual stress that may be present in the individual layers, that the overall stress in the entire stack of layers on the flexible membrane can be treated in its entirety in terms of its effect on the optical properties of the device.

It is known that the ions can become incorporated within the material being coated on the membrane. The use of an oxygen ion beam for the formation of oxide films is thus an advantage. It is believed that the process of stress control beyond densification is achieved via momentum transfer between the impinging ions and the growing film. The energy transfer is believed to be sufficient to dislodge one of the lattice atoms and send that lattice atom to an interstitial location or a grain boundary. This can lead to swelling of the lattice or grain boundary and increase in the residual compressive stress in the material. Thus, as the voltage is increased, the residual compressive forces resulting from momentum transfer will tend to increase compressive stresses and counteract the residual tensile stresses, which are developed during film formation.

Figure 3:
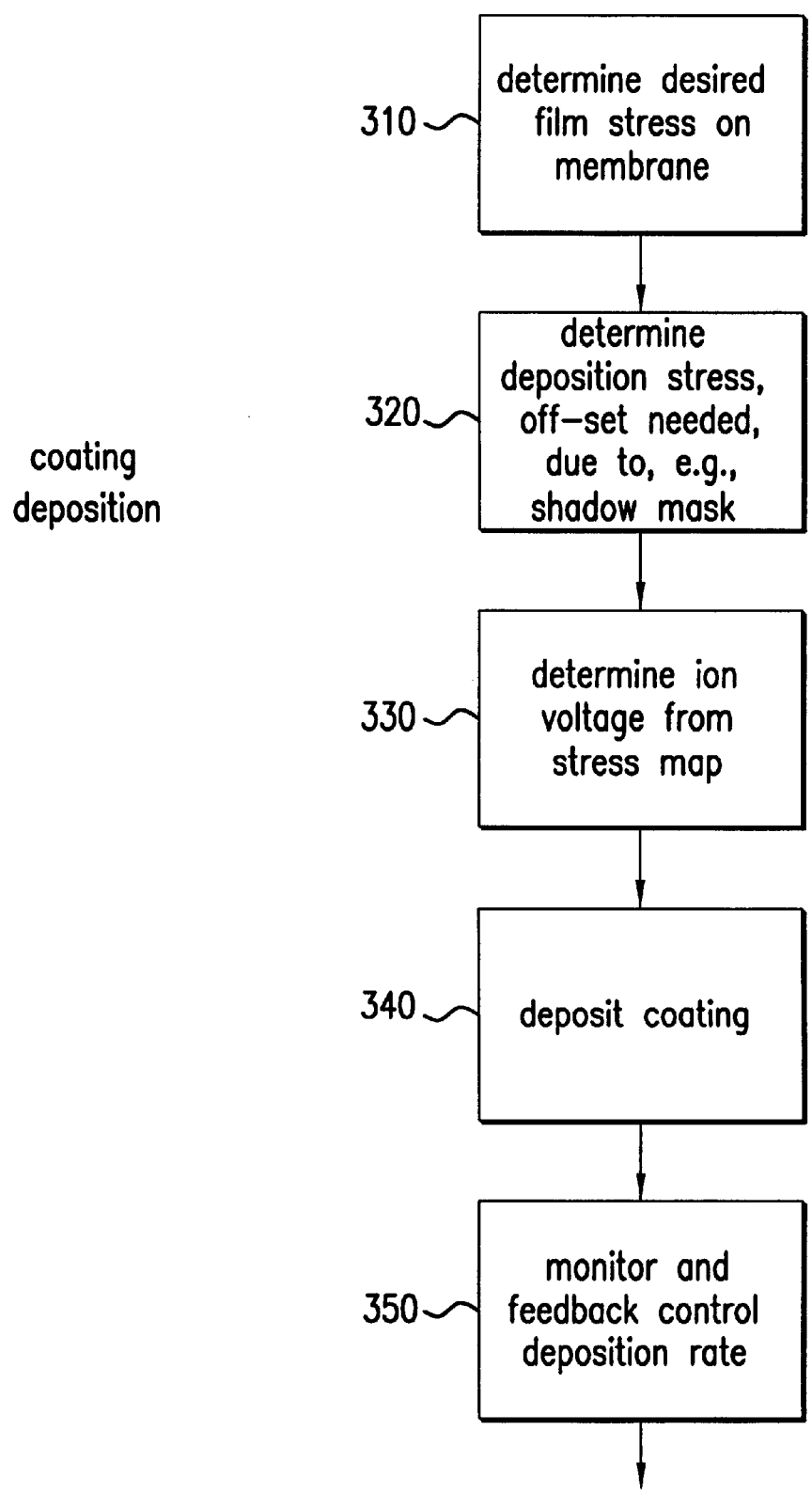
FIG. 3 is a flow diagram illustrating the production of a thin film coating having a desired stress.

FIG. 3 illustrates the process for depositing a controlled stress thin film coating during membrane production.

In step 310, the desired, residual film stress is determined. Further, in step 320 it is assessed whether or not a mask will be used. If coating is to be performed with a mask 36, the coating parameters of a masked or unmasked structure will be different, to achieve effectively low residual stress. Thus, if the final product is a masked product, the parameters will typically be chosen to yield a tensile stress on the stress witness piece in contrast to an unmasked condition, in which a substantially zero stress condition is typically desired.

Next in step 330, for the chosen evaporation rates, the stress map is consulted to determine the ion voltage that will yield the desired coating stress, typically with fixed anode current.

During the coating step 340, the deposition rate is monitored in step 350 so the desired stress conditions result based upon the previous stress mapping due to the deposition rate dependency of the stress. Generally, if the evaporation rate changes, the voltage change will probably be needed.

Thus, single and multi layer thin films can be built up on a thin flexible substrate through the use of ion assisted thermal evaporation to form coated membranes which do not exhibit any substantial "bow" and which have effectively low residual stress, so as not to adversely affect the optical properties thereof.

Structures in accordance with the invention include highly reflective coatings that are over 99% reflective, over 99.9% reflective and even over 99.95% reflective, depending on the needed application. In one embodiment of the invention, the bandwidth employed with the tunable filter product is about 1 nm for a free-space cavity of about 10 $\mu$m length. If the finesse is 100 or more then $\pi/1-R=100$ and reflectively (R) is at least about 97%. Thus, effectively low stress thin films having highly reflective coating can be employed to achieve reflectivity values greater than 97%.

In one embodiment of the invention, a multi-layer structure including 18 alternating layers of $TiO_2$ and $SiO_2$ is deposited to achieve over 99.95% reflectivity and effectively low overall stress, so as not to impart a shape change to the membrane and to yield an effectively flat surface.

In another embodiment of the invention, 27 alternating layers of the $Ta_2O_5$ and $SiO_2$ are deposited to achieve over 99.95% reflectivity and effectively low residual stress, so as to impart substantially no bow to a thin flexible membrane.

Figure 4:
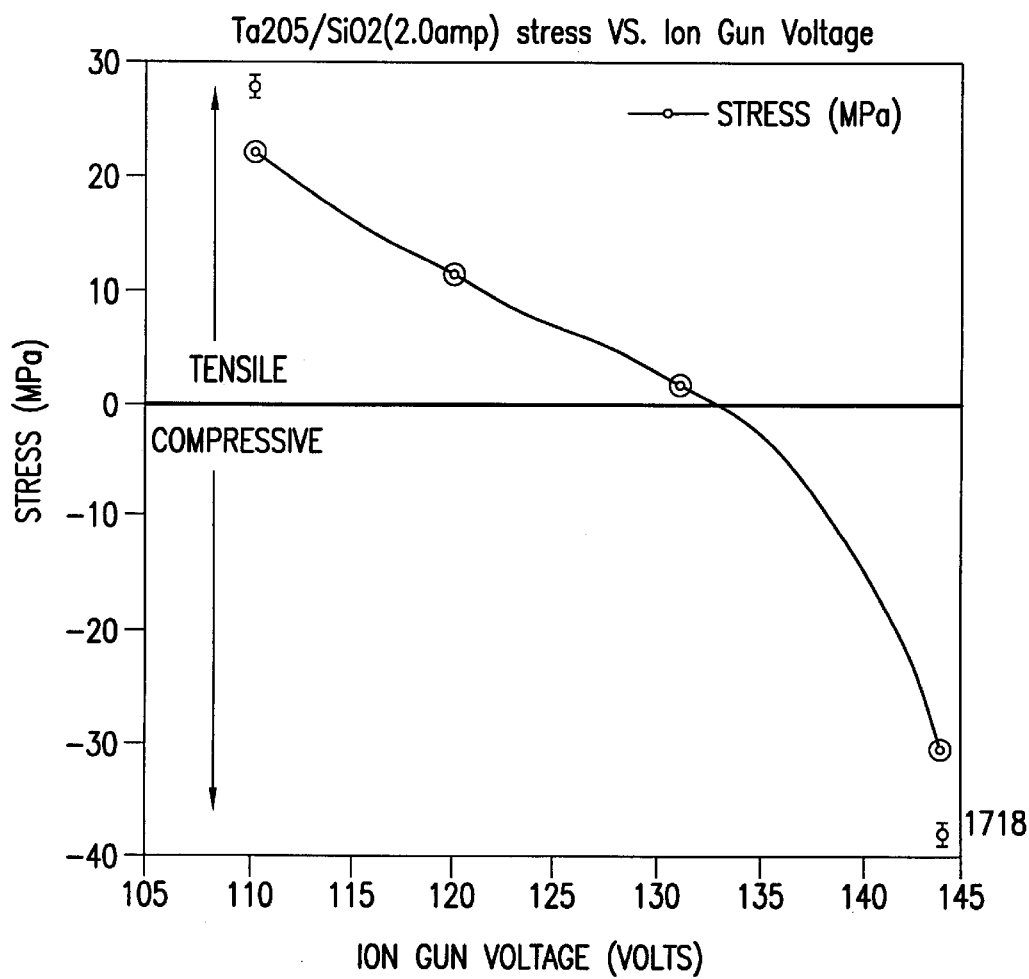
FIG. 4 is a graph showing the change in stress with ion gun voltage during the application of a multi-layer $Ta_2O_5/SiO_2$ system in which the ion gun was run at 2 Amperes and voltage was varied from 110 Volts to 144 Volts.

Referring to FIG. 4, alternating layers of $Ta_2O_5$ and $SiO_2$ were deposited with an electron beam, in which the ion gun current was set at 2 amps. As can be seen in the plot, as voltage was increased from 110 volts to 144 volts, the residual tensile stress in the material decreased. At approximately 122 volts, the tensile stress became about 10 MPa and at about 138 volts, the compressive stress became about 10 MPa. Thus, it was determined tat the stress was controllable over a fairly small excursion in magnitude of ±30 MPa by a fairly large variation in ion anode voltage of ±18 volts. Also, voltage variations from about 122 to 138 volts (a 16 volt window) resulted in effectively small stress of the overall coating when wafer bow measurements were taken for coatings having substantially no porosity.

Figure 5:
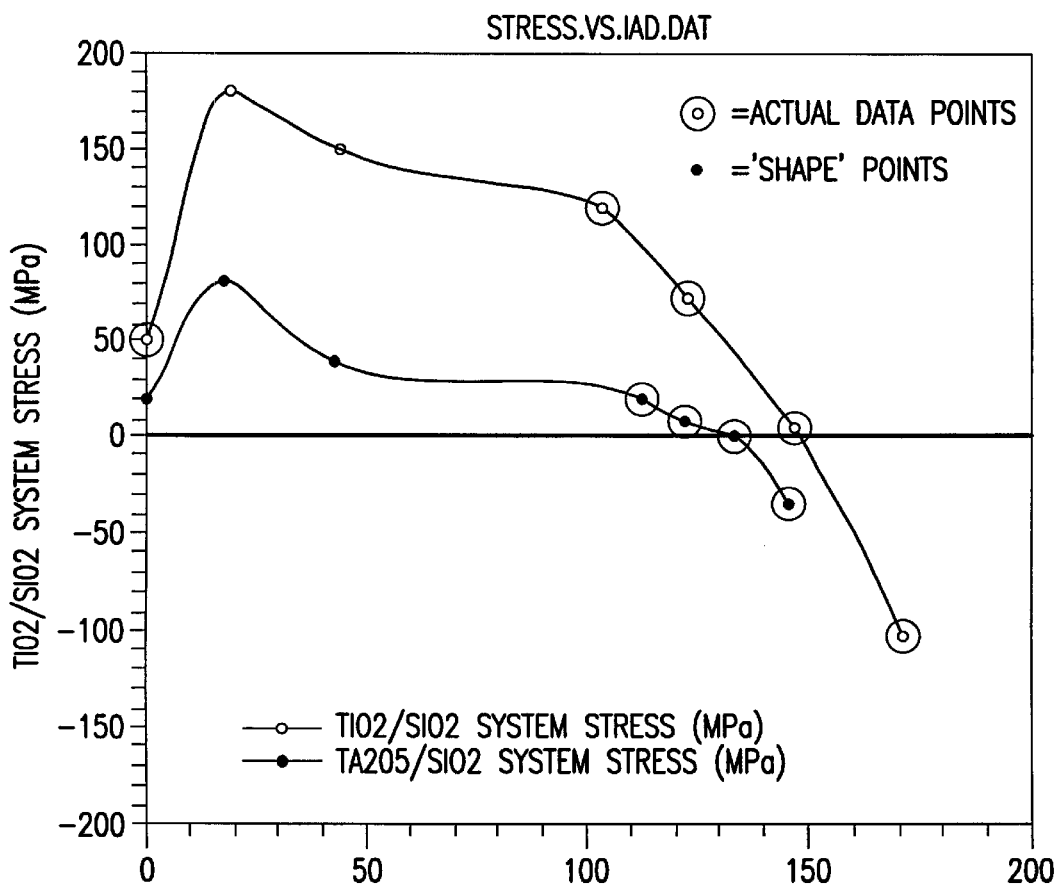
FIG. 5 is a graph showing the change in stress with voltage of both a $TiO_2/SiO_2$ and $Ta_2O_5/SiO_2$ system with ion beam gun anode voltage varying from 0 to 170 Volts.

Referring to FIG. 5, it can be seen that the $TiO_2/SiO_2$ system is more highly sensitive to voltage variations than is the $Ta_2O_5/SiO_2$ system. On the other hand, a $TiO_2/SiO_2$ system requires fewer layers to achieve higher reflectivity. It was also determined that the use of a mask imparts as much as an 80 MPa compressive offset. Thus, because the $TiO_2/SiO_2$ system exhibits wider variations in stress, it is in some circumstances more versatile and varying the voltage can overcome changes in the residual stress of the system as a result of a masking operation, for example.

While this invention has been particularly shown and described with references to preferred embodiments thereof, it will be understood by those skilled in the art that various changes in form and details may be made therein without departing from the scope of the invention encompassed by the appended claims.

What is claimed is:

1. A coated membrane structure, comprising:
    a membrane having a thin film coating thereon, said coating having an overall residual stress of less than about 15 MPa;
    wherein the coating has over 97% reflectivity.

2. The membrane structure of claim 1, wherein the residual stress is less than 10 MPa.

3. The membrane structure of claim 1, wherein the residual stress is substantially not observable.

4. A coated membrane structure, comprising:
    a membrane having a thin film coating thereon, said coating having an overall residual stress of less than about 15 MPa;
    wherein the coating has over 99% reflectivity.

5. A coated membrane structure, comprising:
    a membrane having a thin film coating thereon, said coating having an overall residual stress of less than about 15 MPa;
    wherein the coating is a reflective coating and comprises alternating layers of different oxides.

6. The membrane structure of claim 5, wherein the coating has over 97% reflectivity.

7. The membrane structure of claim 5, wherein one of the oxides is $SiO_2$.

8. The membrane structure of claim 5, wherein one of the oxides is $Ta_2O_5$.

9. The membrane structure of claim 5, wherein one of the oxides is $TiO_2$.

10. A coated membrane structure, comprising:
    a membrane having a thin film coating thereon, said coating having an overall residual stress of less than about 15 MPa;
    wherein the coating comprises alternating layers of $TiO_2$ and $SiO_2$.

11. A coated membrane structure, comprising:
    a membrane having a thin film coating thereon, said coating having an overall residual stress of less than about 15 MPa;
    wherein the coating comprises alternating layers of $Ta_2O_5$ and $SiO_2$.

12. A coated micro-optical electromechanical systems (MOEMS) structure, comprising:
    a device layer having a thin film coating thereon, said coating having an overall residual stress of less than about 15 MPa;
    wherein the coating has over 97% reflectivity.

13. The MEOMS structure of claim 12, wherein the residual stress is less than 10 MPa.

14. The MEOMS structure of claim 12, wherein the residual stress is substantially not observable.

15. A coated micro-optical electromechanical systems (MOEMS) structure, comprising:
   a device layer having a thin film coating thereon, said coating having an overall residual stress of less than about 15 MPa;
   wherein the coating has over 99% reflectivity.

16. A coated micro-optical electromechanical systems (MOEMS) structure, comprising:
   a device layer having a thin film coating thereon, said coating having an overall residual stress of less than about 15 MPa;
   wherein the coating is a reflective coating and comprises alternating layers of different oxides.

17. The MEOMS structure of claim 16, wherein the coating has over 97% reflectivity.

18. The MEOMS structure of claim 16, wherein one of the oxides is $SiO_2$.

19. The MEOMS structure of claim 16, wherein one of the oxides is $Ta_2O_5$.

20. The MEOMS structure of claim 16, wherein one of the oxides is $TiO_2$.

21. A coated micro-optical electromechanical systems (MOEMS) structure, comprising:
   a device layer having a thin film coating thereon, said coating having an overall residual stress of less than about 15 MPa;
   wherein the coating comprises alternating layers of $TiO_2$ and $SiO_2$.

22. A coated micro-optical electromechanical systems (MOEMS) structure, comprising:
   a device layer having a thin film coating thereon, said coating having an overall residual stress of less than about 15 MPa;
   wherein the coating comprises alternating layers of $Ta_2O_5$ and $SiO_2$.

23. A coated micro-optical electromechanical systems (MOEMS) structure, comprising:
   a device layer having a thin film coating thereon, said coating having an overall residual stress of less than about 15 MPa;
   wherein the device layer is suspended over handle material.

24. The membrane structure of claim 12, wherein the device layer is less than 50 micrometers thick.

25. A coated micro-optical electromechanical systems (MOEMS) structure, comprising:
   a device layer having a thin film coating thereon, said coating having an overall residual stress of less than about 15 MPa;
   wherein the membrane is suspended over handle material.

26. The membrane structure of claim 1, wherein the membrane is less than 50 micrometers thick.

* * * * *